INVENTOR.
CARL A. BERGFORS

BY P. E. Henninger

ATTORNEY

INVENTOR.
CARL A. BERGFORS
BY P. E. Henninger
ATTORNEY

INVENTOR.
CARL A. BERGFORS
BY P. E. Henninger
ATTORNEY

United States Patent Office 2,935,690

Patented May 3, 1960

2,935,690

TRANSISTOR TUBE SWITCHING CIRCUITS

Carl A. Bergfors, Mountain View, Calif., assignor to International Business Machines Corporation, New York, N.Y., a corporation of New York Application January 13, 1955, Serial No. 481,651

14 Claims. (Cl. 328—198)

This invention relates to transistor-tube switching circuits and especially to such circuits employing a tube and a transistor with their outputs connected in parallel and arranged to be alternately conducting.

A switching circuit may be defined as one whose output changes suddenly from a high to a low value or vice versa, due typically to a change in impedance of a translating device, e.g. a tube or a transistor, from a low impedance to a high impedance condition.

Conventional transistor switching circuits have advantages of sensitivity and low power requirements as compared to vacuum tube switching circuits. Vacuum tube switching circuits have, on the other hand, considerable advantages of stability as compared to transistor circuits. The vacuum tube circuits are more stable with respect to variations in operating characteristics with time and with temperature. They are also more stable with respect to variations which may occur upon replacement of individual components in the circuit. That is to say, the characteristics of vacuum tubes are presently more highly standardized than are the characteristics of transistors.

An object of the present invention is to provide an improved switching circuit having some of the advantages of transistor switching circuits and other advantages of vacuum tube switching circuits.

Another object is to provide an improved bistable scaling trigger circuit.

Another object is to provide an improved free-running multivibrator circuit.

Another object is to provide an improved frequency divider circuit.

A further object is to provide a frequency divider circuit in which the output frequency is controlled independently of the amplitude of the input signals.

Another object is to provide an improved frequency divider circuit in which the output frequency is controlled by the amplitude of the input signals.

The foregoing and other objects of the invention are attained by providing a switching circuit including a tube and a transistor having the internal impedances between their output and common electrodes connected in parallel branch circuits which are in series with a common source of electrical energy and a common load resistor. A cross feedback path is provided between the tube output circuit and the transistor input circuit. Another cross feedback from the transistor output circuit to the tube input circuit is provided, which may include the common load resistor. An additional cross feedback may be provided from the transistor output circuit to the tube input circuit, serving as an addition to or as an alternate for the cross feedback through the common load resistor. Each of the several cross feedbacks is negative, i.e. it tends to cut the tube off when the transistor is producing output current, and vice versa.

In the trigger circuit disclosed herein, the additional feedback from the transistor output circuit to the tube input circuit includes three series connected capacitors. In this circuit, the switching action from one stable output state to the other is always initiated by an input signal.

In the free running multivibrator circuit, the additional cross feedback from the transistor output circuit to the tube input circuit comprises a resistor and a capacitor in series. The time constant of this feedback connection principally determines the frequency of operation of the multivibrator. There are no input signals, the circuit running freely as a result of signals fed back to its respective input circuits from the opposite output circuits.

In the frequency divider circuit, the common load resistor is included in a cross feedback circuit connected to the transistor output circuit and to the tube input circuit. The switching of the circuit from one condition to the other is determined by the interaction of this cross feedback with a capacitance and resistance circuit connected between the signal input terminals and the control electrode of the tube.

Other objects and advantages of the invention will become apparent from a consideration of the following specification and claims, taken together with the accompanying drawings.

Figure 1:
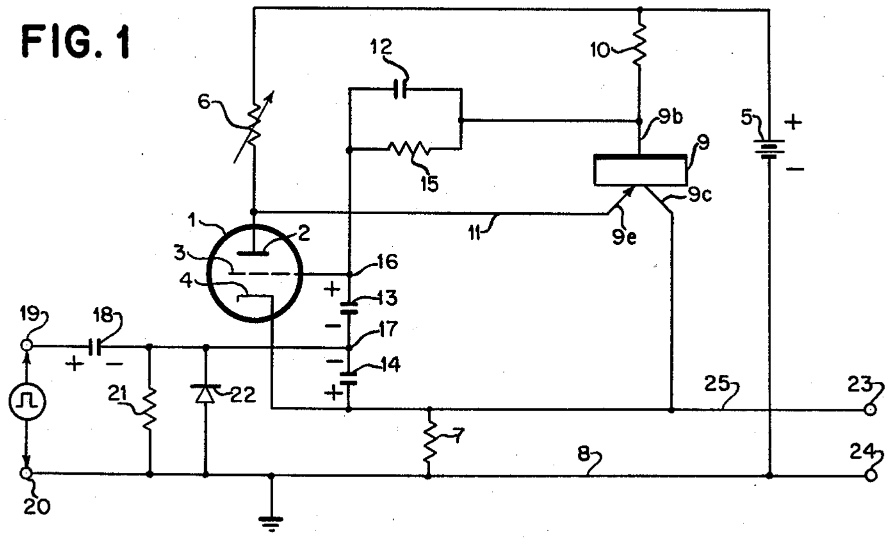
Fig. 1 is a wiring diagram of a bistable scaling trigger circuit embodying the invention.
Figure 2:
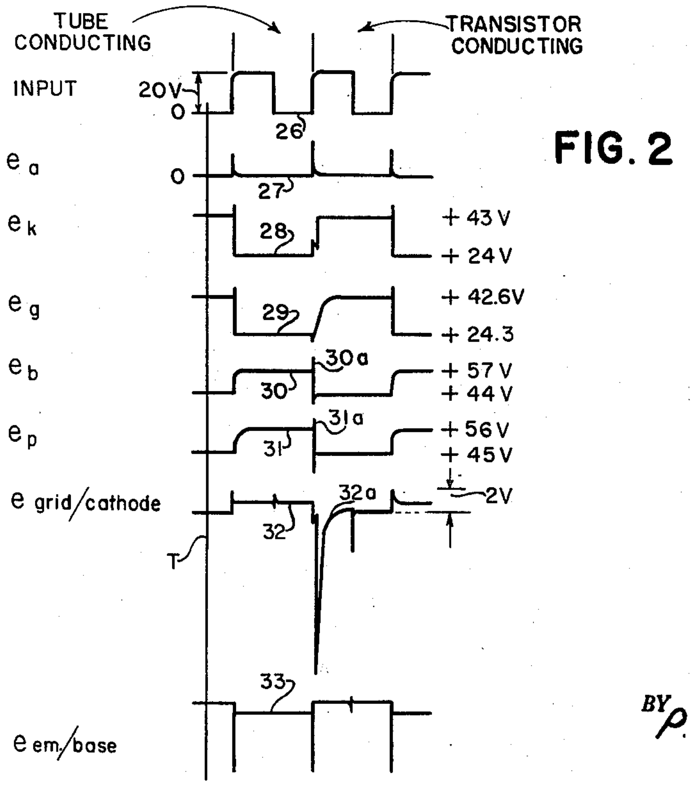
Fig. 2 is a graphical illustration, showing the variation with time of certain potentials in the circuit of Fig. 1.

*Figs. 1 and 2*

There is shown in Fig. 1 a vacuum tube or electric discharge device 1 having an anode 2, a control electrode 3 and cathode 4. The device 1 has an output circuit which is supplied with electrical energy from a battery 5, and which may be traced from the positive terminal of battery 5 through a variable resistor 6, anode 2, cathode 4, a fixed resistor 7 and a grounded conductor 8 to the negative terminal of battery 5.

A transistor 9 has an emitter electrode **9*e*, a collector electrode 9*c* and a base electrode 9*b*. The output circuit for transistor 9 may be traced from the positive terminal of battery 5 through a fixed resistor 10, base 9*b*, collector 9*c*, resistor 7 and wire 8 back to the negative terminal of battery 5**.

The emitter **9*e* is connected through a wire 11 to the anode 2 of vacuum tube 1. The base 9*b* is connected through three capacitors 12, 13 and 14 in series to the cathode 4. A fixed resistor 15 is connected in parallel with capacitor 12. The common junction 16 of capacitors 12 and 13 is connected to the control electrode 3. The common junction 17 of capacitors 13 and 14 is connected through a capacitor 18 to a signal input terminal 19. Another signal input terminal 20 is connected to the grounded wire 8. A resistor 21 and parallel diode 22 are connected between the right-hand terminal of capacitor 18 and the grounded wire 8**.

A pair of output terminals 23 and 24 are provided, output terminal 23 being connected to cathode 4 and output terminal 24 being connected to the grounded wire 8.

*Operation of Fig. 1*

The resistor 7 operates as a common load resistor in the output circuits of the tube 1 and the transistor 9. The tube 1 operates as a cathode follower, since it has its principal load impedance between the cathode and the battery 5, so that the potential of cathode 4 tends to follow the variations in the potential of the control electrode 3.

The circuit of Fig. 1 is stable in either of two states. In one of those states, the tube 1 is non-conductive and the transistor 9 is conducting a substantial current in its output circuit. In the other stable state of the circuit, the tube 1 is conducting a substantial current, and the current flow through the transistor output circuit is substantially cut off. The circuit of Fig. 1 is switched back and forth between its two output states in response to input signals applied to the input terminals 19 and 20. These input signals are assumed, for the purposes of the present discussion, to be positive square wave signals. The spacing between the signals is not material.

The capacitor 18 and the resistor 21 operate as a conventional differentiating circuit to convert the square wave input to peaked pulses. The diode 22 eliminates the pulses corresponding to the trailing edge of the input signal. The input signal varies with time as illustrated by the curve 26 in Fig. 2. The potential ($e_a$) at junction 17, which represents the input signal as modified by capacitor 18, resistor 21 and diode 22, is illustrated by the curve 27 in Fig. 2.

Curve 28 in Fig. 2 illustrates the potential ($e_k$) of cathode 4 with respect to ground. Curve 29 illustrates the potential ($e_g$) of control electrode 3 with respect to ground. Curve 30 illustrates the potential ($e_b$) of the base $9_b$ with respect to ground. Curve 31 illustrates the potential ($e_p$) of anode 2 and emitter 9*e* with respect to ground. Curve 32 illustrates the potential of control electrode 3 with respect to cathode 4. Curve 33 illustrates the potential of emitter 9*e* with respect to the base 9*b*.

Note that in this circuit none of the electrodes of the tube operates at a fixed potential, and that none of the electrodes of the transistor operates at a fixed potential. For that reason, it is difficult to determine accurately the particular sequence of events which takes place as the circuit switches back and forth between its stable output conditions. In the following description, a specific sequence of events is described in detail. This specific sequence appears to be theoretically sound and has been checked experimentally as far as possible. However, since it is not possible to check all parts of this sequence because of the short times involved, it is not intended that this invention is to be limited to the specific sequence described. The statements in this paragraph are considered to be applicable to the circuits of Figs. 3 and 5 as well as to the circuit of Fig. 1.

Consider the conditions existing at time T in Fig. 2. Tube 1 is Off and transistor 9 is On. The anode 2 is then at the lower of its two potentials (i.e. 45 volts, see curve 31), since the emitter current is greater than the anode current which flows during the alternate state, and the potential drop across resistor 6 is consequently greater. The base 9*b* is at a slightly lower potential (44 volts, see curve 30), because of the potential drop across resistor 10 due to the transistor output current. Emitter 9*e* is hence more positive than base 9*b*, and transistor 9 therefore is in a conductive condition.

Junction 17 is now substantially at ground potential, since it is conductively connected to ground through resistor 21, and there is no current flow through that resistor to maintain a potential drop across it. The potential at base 9*b* is conductively applied to junction 16 and control electrode 3 via resistor 15. Cathode 4 is also positive with respect to ground, because of the potential drop across resistor 7. The potentials at the base 9*b*, control electrode 3 and cathode 4 are now all approximately equal and the tube 1 is at zero bias condition. Also, the anode 2 potential is only slightly positive with respect to cathode 4. Current flow through tube 1 is therefore substantially cut off.

Under these conditions, assume that a positive input signal pulse is transmitted through input terminals 19 and 20 and appears as a peak at junction 17. This positive peak is transmitted through capacitor 13 and junction 16 to the control electrode 3, turning the tube On. It is also transmitted through capacitor 12 and resistor 15 to the base 9*b* of the transistor, increasing the base potential and thereby reducing the emitter current and consequently the collector current. The resulting reduction in the collector current reduces the potential drop across resistor 7, thereby lowering the potential of cathode 4. Similarly, the reduction in collector current reduces the potential drop across resistor 10, thereby raising the potential of the base 9*b* and causing still further reduction in emitter current. The reduction of the emitter current reduces the potential drop across resistor 6, raising the potential of anode 2. These variations in the control electrode, cathode and anode potentials all tend to increase the output current of the tube. These effects continue cumulatively until a condition is reached in which the transistor is in its minimum conductivity or Off state and the tube is in its On state.

The potential drop across resistor 6 due to the anode current flowing to the tube now holds the emitter 9*e* negative with respect to base 9*b*, which is now substantially at the potential of the positive terminal of battery 5. Transistor 9 therefore remains Off. Control electrode 3 remains positive with respect to cathode 4, since it is connected through resistors 15 and 10 to the positive terminal of battery 5, and tube 1 remains On.

Now assume that a second input signal of the same wave shape and polarity as the first signal is impressed on the input terminals 19 and 20. This action appears at the junction 17 as a positive peak. This positive peak potential is transmitted through capacitor 14 to cathode 4 and thence through resistor 7 to ground. At the same time, it is transmitted through capacitors 13 and 12 in series, resistor 10 and battery 5 to ground. These capacitors form a voltage divider with the control electrode 3 connected to an intermediate point 16 of the voltage divider. The potential of cathode 4 is determined by the division of the peak potential between capacitor 14 and resistor 7. The impedance of capacitor 14 to this peak pulse is very low as compared to the impedance of resistor 7. Consequently, cathode 4 receives almost the full potential of the peak pulse. In a similar manner, most of the impedance to the peak pulse in the path through capacitors 13 and 12 and resistor 10 is in the resistor 10. Consequently, control electrode 3 also receives substantially the full potential of the peak pulse. This positive swing of control electrode 3 causes a momentary high current to flow through tube 1 and hence through load resistor 7. This current flow through resistor 7 increases the potential drop across it, and swings the cathode even more positive. The combined effect of this high current flow and of the peak input pulse swing the cathode more positive than the control electrode and the tube cuts off.

The transistor was off when the peak input pulse was received. The positive pulse passing through capacitors 13 and 12 to base 9*b* tends to keep the transistor off. This effect is enhanced by the high current pulse through the tube, which tends to shunt the transistor effectively. Consequently, at an instant just after the input pulse, both the tube and the transistor are cut off momentarily.

When the tube and transistor are both cut off, the base potential of the transistor and the anode potential of the tube both rise sharply—see the peaks 30*a* and 31*a* on the curves 30 and 31 in Fig. 2. The increase in the base potential is transmitted through capacitor 12 and resistor 15 to control electrode 3, where it tends to turn the tube on. However, at the same time, the increase in the anode potential is transmitted to emitter 9*e*, where it tends to turn the transistor on. In a manner of speaking, the tube and the transistor race toward conduction. The transistor wins the race, because there is less capacitance in the path from the positive battery terminal through resistor 6 to emitter 9*e* than in the path from the base 9*b* through resistor 15 and capacitor 12 to control electrode 3. Hence the potential of emitter 9*e* rises faster than the potential of control electrode 3, and transistor 9 turns on. When it turns on, the increased current flow through resistor 7 produces a potential drop across it, swinging the cathode 4 more positive than the control electrode 3, and thereby holding tube 1 off.

As shown at 32*a* in Fig. 2, the control electrode-cathode potential rises exponentially toward a final value which represents the cut off bias potential and the tube cannot become conductive. The circuit is now in its alternate stable state where the transistor is conducting and the tube is cut off.

Summarizing, it may be seen that the first impulse applied to input terminals 19 and 20 cuts the transistor Off and turns the tube On, and that a succeeding impulse cuts the tube Off and turns the transistor On. The transistor conducts substantially more current than the tube so that the potential appearing at the output terminals 23 and 24 is substantially greater when the transistor is On than when the tube is On. Consequently, it may be seen that two successive square wave input signals at the terminals 19 and 20 produce a single square wave output signal at terminals 23 and 24. The circuit may therefore be said to scale or count the input signals according to the binary system, producing one output signal for each two input signals.

Figures 3, 4:
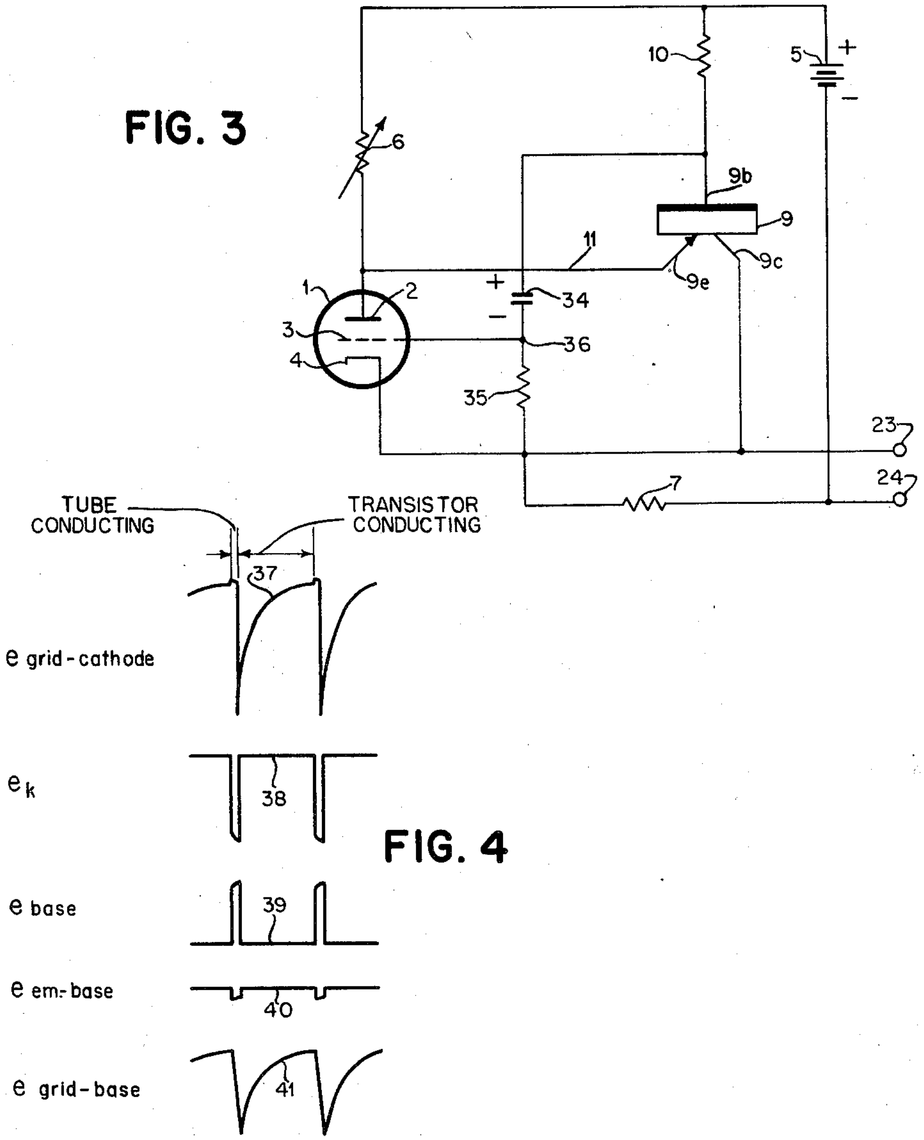
Fig. 3 is a wiring diagram showing a free-running multivibrator circuit embodying the invention.
Fig. 4 is a graphical illustration showing the variation with time of certain potentials in the circuit of Fig. 3.

*Figs. 3 and 4—Free-running multivibrator circuit*

Many of the circuit elements in Fig. 3 correspond exactly to their counterparts in Fig. 1. In those instances, the circuit elements have been given the same reference numerals in both figures, and will not be further described.

The circuit of Fig. 3 differs from the circuit of Fig. 1 in that the base 9*b* is connected to the cathode 4 through a capacitor 34 and a resistor 35 in series. The junction 36 between capacitor 34 and resistor 35 is connected to control electrode 3.

This circuit operates as a free-running multivibrator, i.e. it produces at the output terminals 23 and 24 a continuing series of square wave output pulses, at a frequency determined by the circuit parameters chosen.

Curve 37 in Fig. 4 illustrates the control electrode-to-cathode potential in the circuit of Fig. 3. Curve 38 illustrates the variation in the cathode-to-ground potential. Curve 39 illustrates the variation in the base potential. Curve 40 illustrates the variation in the emitter-to-base potential. Curve 41 illustrates the variation in the control electrode-to-base potential.

*Fig. 3—Operation*

Let us initially consider a time when the tube 1 is Off and the transistor 9 is On. The potential drop developed across resistor 10 is transmitted through capacitor 34 to the control electrode 3, where it is effective to cut off the tube 1. The capacitor 34 is at this time charged with its lower terminal negative, the charge having been acquired during the preceding cycle in a manner described below, and is thereby effective momentarily to hold the tube 1 cut off, since that negative potential is applied directly to the control electrode 3. The charge on capacitor 34 starts leaking off through the base-collector impedance of the transistor 9 and the resistor 35, allowing the potential of control electrode 3 to swing in a positive sense. When the charge on capacitor 34 is sufficiently reduced, the tube 1 begins to conduct. The tube 1 now represents a low value of resistance in series with resistor 6. These two elements effectively shunt the resistor 10 and transistor 9 so as to reduce current flow therethrough. This causes the potential of the base 9*b* to rise until it eventually becomes more positive than the emitter 9*e*. It should be observed that this action is cumulative since the resulting positive pulse at base 9*b* is fed via capacitor 34 to the control element 3 of the tube, causing the effective resistance of the tube to be still further reduced. This sequence continues cumulatively until the transistor is substantially Off and the tube is On.

The capacitor 34 now has a high potential across it, and charges rapidly, the charging current flowing through the control electrode 3 and cathode 4, by-passing the resistor 35. When the condenser is completely charged, the charging current ceases to flow and the control electrode-to-cathode potential goes from a slightly positive value to zero, thereby reducing the anode current in the tube slightly and raising the potential of the anode and of the emitter. This increase in the emitter potential produces an increase in the emitter and collector currents. The increased collector current produces an increased potential drop across resistor 7, thereby raising the cathode potential and further decreasing the anode current in the tube. The collector current at this time includes the discharge current from capacitor 34, which is flowing through resistor 35 in a direction to swing the control electrode 3 in a negative sense with respect to the cathode 4. This process continues cumulatively until the transistor is fully On, at which time the cathode 4 is sufficiently positive with respect to the control electrode potential to cut off the tube. The tube is then Off, the transistor On and the capacitor 34 is charged as in the initial state assumed above.

As indicated by the legend in Fig. 4 of the drawing, the circuit of Fig. 3 has a very low mark-space ratio. In other words, the mark portion of the cycle during which the tube is conductive is considerably shorter than the space portion of the cycle during which the transistor is conductive.

The circuit of Fig. 3 has been operated at frequencies varying from less than 1 cycle per second up to a maximum of 350 kilocycles per second. The output voltage amplitude remained constant throughout this range of frequencies.

During this frequency variation, the "mark" time remained substantially constant at all frequencies, the difference in the duration of the cycles being accounted for by variation of the "space" time.

Figure 5:
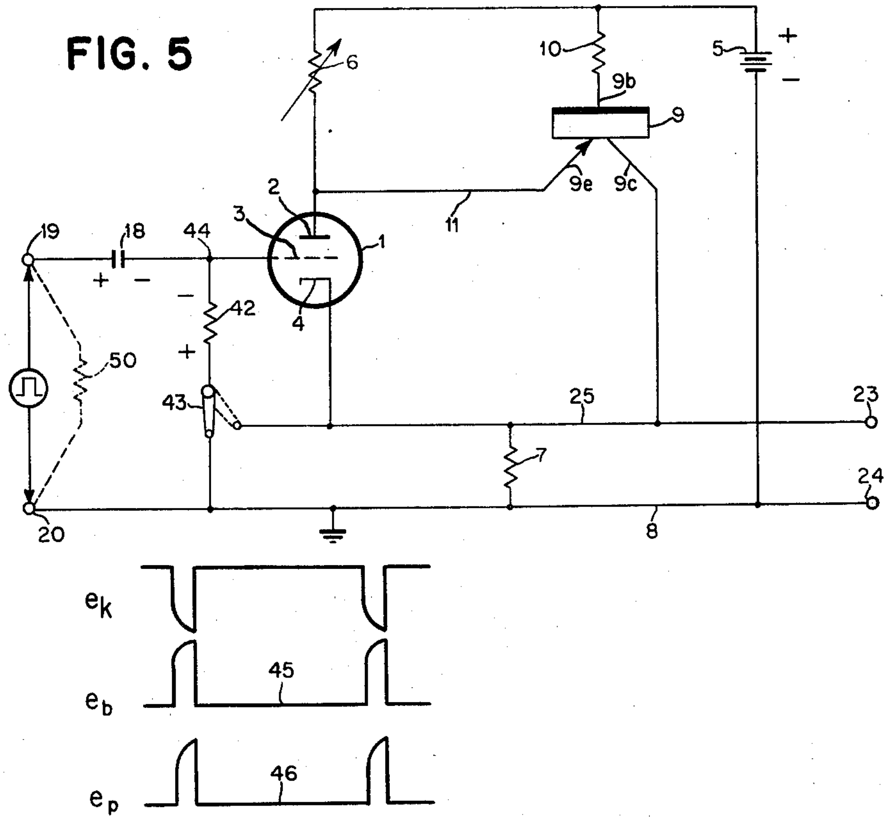
Fig. 5 is a wiring diagram of a frequency divider circuit embodying the invention.

*Fig. 5—Frequency divider circuit*

Those circuit elements in Fig. 5 which correspond exactly to their counterparts in Figs. 1 and 3 have been given the same reference numerals, and will not be further described.

In Fig. 5, the input terminals 19 and 20 are connected through a circuit including in series the capacitor 18, a resistor 42 and a switch 43. Switch 43 is movable between the position illustrated in full lines in the drawing, wherein the lower terminal of resistor 42 is connected directly to grounded wire 8, and a second position, illustrated in dotted lines, wherein the lower terminal of resistor 42 is connected to cathode 4. The control electrode 3 is connected to the junction 44 between capacitor 18 and resistor 42.

This circuit operates as a frequency divider. That is to say, when a square wave of predetermined frequency is applied to the input terminals 19 and 20, a square wave of lower frequency appears at the output terminals 23 and 24. The output frequency is equal to the input frequency divided by a predetermined factor.

With the switch 43 in the full line position shown, the frequency dividing factor may be selected by adjusting the value of resistor 6. Reducing the resistance of resistor 6 increases the frequency dividing factor. That factor is, over substantially the entire range of operating frequencies, insensitive to variations in the input pulse amplitude.

When the switch 43 is in the dotted line position, the frequency dividing factor is determined by the input pulse amplitude, in a manner such that decreasing the input pulse amplitude provides larger frequency dividing factors. Since the operation of the circuit is quite different when switch 43 is in its two different positions, the two modes of operation of the circuit will be described separately.

Figure 6:
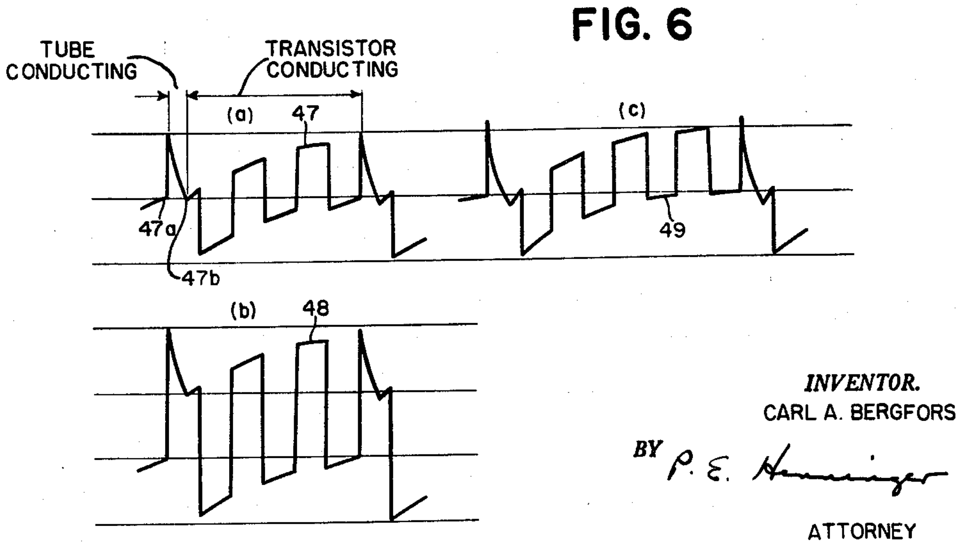
Fig. 6 is a graphical illustration showing the variation with time of certain potentials in the circuit of Fig. 5.

The curve 45 in Fig. 6 illustrates the variation of the base-to-ground potential in the circuit of Fig. 5. The curve 46 illustrates the variation of the anode and emitter-to-ground potential in that circuit. Curve 47 illustrates the variation of the control electrode-to-ground potential under one condition of input signal amplitude. Curve 48 illustrates the variation of control electrode-to-ground potential with an increased input signal amplitude. Curve 49 illustrates the variation of control electrode-to-ground potential with the same input signal amplitude as in curve 47, but with a new setting of resistor 6.

*Fig. 5—Operation with the frequency dividing factor determined by the value of resistor 6*

This operation assumes that the switch 43 is in its position illustrated in Fig. 5.

The normal condition of the circuit of Fig. 5 is with the transistor 9 On, and the tube 1 Off. The emitter 9*e* is then at the lower of its two potentials. (Compare curve 31 of Fig. 2.) Base 9*b* is at a somewhat more negative potential because of the potential drop through resistor 10. Collector 9*c* and cathode 4 are positive with respect to the negative terminal of battery 5, due to the potential drop across resistor 7.

Under these conditions, assume that a succession of square wave input pulses are applied to the input terminals 19 and 20. In this circuit, the square wave signal generator must have a finite impedance, illustrated in dotted lines at 50 in Fig. 5.

Assume that the tube is Off and that the transistor 9 is On, the tube being held Off by a charge on the capacitor 18 having a polarity such that its right-hand terminal is negative. This charge is acquired in a manner to be described below, and is effective to hold the control electrode 3 sufficiently negative so that the tube 1 is non-conducting.

The charge on capacitor 18 slowly leaks off through resistor 42 and the impedance 50 of the generator. As the charge on capacitor 18 is leaking off, the series of square wave input pulses are applied to the input terminals 19 and 20. These input signals are somewhat smaller in amplitude than the initial charge on the capacitor 18, and are therefore at first ineffective to overcome it and turn the tube 1 On. However, as the capacitor 18 discharges, the potential across it falls to a point where the next square wave input signal is effective to swing the control electrode 3 positive with respect to the cathode 4 and turn the tube On. The curve 47 in Fig. 6 illustrates the variation in the control electrode-to-cathode potential under the conditions described. The point 47*a* on that curve represents the beginning of the input signal which turns the tube On. As soon as the tube turns On, a relatively low impedance path is produced from the input terminal 19 through capacitor 18, control electrode 3, cathode 4, resistor 7 and grounded wire 8 to input terminal 20. The capacitor 18 then charges rapidly, the charging current flowing through this low impedance path.

When the tube 1 turns on, it cooperates with resistor 6 to provide a relatively low impedance shunt path in parallel with the resistor 10 and the base-to-collector impedance of the transistor. The current flow through resistor 10 therefore falls, so that the base potential rises rapidly to a higher potential than the emitter, and transistor 9 cuts off.

The transistor 9 produces a much greater current flow through resistor 7 than does the tube 1, so that when transistor 9 cuts off, the potential drop across resistor 7 is reduced and the potential of cathode 4 is thereby lowered. This reduction in the potential of cathode 4 effectively brings the tube to zero bias condition with the grid-cathode resistance relatively low. The potential of control element 3 and point 44 must therefore drop to the approximate value of potential at cathode 4. Such action increases the potential drop across capacitor 18 and thereby increases the potential to which it is charged.

Similarly, the anode current through resistor 6 is smaller than the alternate state emitter current which flows through resistor 6 when the transistor is conducting. The voltage drop across resistor 6 thereby decreases and allows the emitter potential to rise. At this time the tube is conductive and the transistor is substantially non-conductive. Accordingly, current flow through resistor 10 is decreasing and the base 9*b* potential is rising (see curve 45, Fig. 6).

It has now been shown that the base 9*b* potential rises while the cathode-collector potential falls. The effective collector potential thereby increases to the point where sufficient collector-base current flows through resistor 10 to cause the base 9*b* potential to become negative with respect to emitter 9*e*. This is equivalent to the emitter swinging positive with respect to base. At this instant the transistor is rendered conductive.

Consequently, a large collector current flows through resistor 7 and causes the potential of collector 9*c* and the common-connected cathode 4 to rise sharply. The rising cathode potential effectively reduces current flow through the tube 1. (See Fig. 6, curve $e_k$.) This process continues cumulatively until the transistor 9 is again fully On and the tube 1 is cut off, which condition is reached at the point 47*b* in Fig. 6. The charge on capacitor 18 then starts leaking off through the resistor 42 and impedance 50, as previously described. The potential between the control electrode 3 and the cathode 4 follows the variation illustrated by curve 47 in Fig. 6. The tube remains off until such time as the charge on capacitor 18 has leaked off sufficiently so that its potential is overcome by a succeeding input signal impulse.

As mentioned above, the circuit described is not sensitive to variations in the amplitude of the input signal. In order to explain this phenomenon, reference is made to the curve 48 in Fig. 6, which illustrates the variation in the control electrode potential when the input signal amplitude is substantially twice that which was used in curve 44. While the input signal amplitude is increased, the terminal voltage across the charged capacitor 18 is increased by substantially the same amount during the charging phase of the cycle, so that the input signal pulses have a correspondingly higher negative charge on the capacitor to overcome. The capacitor discharges in substantially the same time, so that the time between output pulses is not changed by the variation in the input signal amplitude. Therefore, it may be seen that the frequency dividing factor, i.e. the ratio of input frequency to output frequency, remains constant regardless of changes in the input signal amplitude.

The frequency dividing factor may be varied as desired by varying the resistance of the variable resistor 6. For example, assume that the resistance of resistor 6 is increased. Considering the conditions when the transistor 9 is conducting, the potential of the emitter 9*e* is decreased because of the greater potential drop across resistor 6. This decreases the emitter and collector currents, with the result that the potential drop across resistor 7 decreases, thereby lowering the potential of the cathode 4. This lowers the value of control electrode potential required to start the tube 1 conducting. If the resistor 6 was initially set so that the tube 1 was conducting on every third input pulse, then a gradual increase in the resistance of resistor 6 would eventually change the characteristics of the circuit so that the tube 1 started tripping on every second input signal pulse. Conversely, if the resistance of resistor 6 is gradually decreased, then the interval between conductive periods of the tube 1 is increased in steps of one input cycle. In other words, an increase in resistance of resistor 6 decreases the frequency dividing factor in steps of one, and a decrease in resistor 6 increases the frequency dividing factor, also in steps of one.

*Operation—Fig. 6—Frequency dividing factor controlled by input signal amplitude*

In order to secure operation of the circuit of Fig. 5, so that the frequency dividing factor is controlled by the input signal amplitude, the switch 43 is thrown from the full line position illustrated in the drawing to the dotted line position, so that the lower terminal of resistor 42 is connected directly to cathode 4. With the switch so positioned, and the transistor 9 On, the potential drop across resistor 7 tends to charge the capacitor 18 through resistor 42 and impedance 50. The polarity of this potential drop is such as to make the right-hand terminal of capacitor 18 positive with respect to ground. Opposing the effect of this potential is the charge on the capacitor 18 which is supplied to it during conductive intervals of the tube 1 in the same manner as in the operation described above. When the switch was in the full line position the input signal applied to terminals 19 and 20 had to overcome the potential drop across resistor 7, which was biasing the cathode 4 positively with respect to the control electrode 3. When the switch is in the dotted line position, the input signal potential does not have to overcome that biasing potential, but on the other hand needs only to overcome the relatively low potential drop due to the flow of discharging current through resistor 42. After the capacitor 18 is once charged by conduction of the tube 1, then the discharging current flowing through resistor 42 develops a potential drop effective to hold the control electrode 3 negative with respect to cathode 4.

As this discharging current continues to flow, it decreases in magnitude, approaching zero asymptotically as the charge on capacitor 18 approaches the potential across resistor 7. The potential drop across resistor 42 due to this current, which potential drop biases the control electrode 3 negatively, likewise approaches zero asymptotically.

The control electrode-to-cathode potential of tube 1 is a composite potential of two components. One component is the negative biasing potential just described, and the other is the square wave input signal, or rather a substantial proportion of that signal, which is superimposed on the biasing potential.

When the capacitor 18 is first charged, this negative biasing potential has its maximum negative value, from which it decreases asymptotically toward zero.

When the negative biasing potential is at its maximum value, it is effective to overcome the input signal component, and holds the tube off. As time goes on, the negative biasing potential decreases from that maximum value, and eventually becomes smaller than the input signal component, whereupon the tube trips on. The particular time at which the tube trips on is determined by the amplitude of the input signal pulses.

When the capacitor 18 is substantially fully discharged, then only a very small positive input signal will be sufficient to start the tube 1 conducting. Consequently, the time between conductive periods of the tube 1 is dependent upon the amplitude of the input pulses. As the input pulse amplitude decreases, the frequency dividing factor increases.

The circuit of Fig. 5 has been operated over a wide range of input frequencies varying from 1 cycle per second up to 350 kilocycles per second. A wide range of dividing factors has also been obtained with this circuit, varying from 2 up to several hundred.

The following table shows, by way of example, a particular set of values for the potentials of the various batteries and for the impedances of the various resistors, in a circuit which has been operated successfully. It will be understood that these values are set forth by way of example only and that the invention is not limited to these values or any of them. No values are given for the diode 22, which may be a germanium diode, and is considered to have substantially zero impedance in its forward direction and substantially infinite impedance in its reverse direction.

*Table I*

| Circuit element: | Description |
|---|---|
| Tube 1 | Type 12AU7. |
| Battery 5 | 70 volts. |
| Resistor 6 | 0–5000 ohms. |
| Resistor 7 | 4300 ohms. |
| Transistor 9 | N-type, point contact, $\alpha > 1$. |
| Resistor 10 | 3,500–10,000 ohms. |
| Capacitor 12 | 100 mmf. |
| Capacitor 13 | 20 mmf. |
| Capacitor 14 | 500 mmf. |
| Resistor 15 | 150,000 ohms. |
| Capacitor 18 | .006 mf. |
| Resistor 21 | 10,000 ohms. |
| Capacitor 34 | 100 mmf. |
| Resistor 35 | 150,000 ohms. |
| Resistor 42 | 150,000 ohms. |
| Impedance 50 | 500–5,000 ohms, approx. |

While I have shown and described a preferred embodiment of my invention, other modifications thereof will readily occur to those skilled in the art and I therefore intend my invention to be limited only by the appended claims.

I claim:

1. An electric switching circuit comprising an electric discharge device having an anode, a cathode, and a control electrode, a transistor having a base electrode, an emitter electrode and a collector electrode, a source of unidirectional electrical energy; a first circuit including in series said source, a first resistor, the anode and cathode of said discharge device, and a second resistor; a second circuit including in series said source, a third resistor, the base and collector electrodes of said transistor, and said second resistor; and means directly connecting said anode and said emitter electrode; means including a resistance-capacitance network connected to said control electrode and to said source to control the switching time of the circuit, the flow of current in said first circuit when said discharge device is conductive being effective to produce a potential drop across said first resistor sufficient to hold said emitter electrode at a potential such that said second circuit is substantially non-conductive, and the flow of current in said second circuit when said transistor is conductive being effective to produce a potential drop across said second resistor sufficient to hold said cathode at a potential tending to cut off the flow of current in said first circuit, so that when said discharge device is conducting current, said transistor is substantially cut off, and when said transistor is conducting current, said discharge device is substantially cut off.

2. An electric switching circuit as defined in claim 1, comprising means operable when one of said first and second circuits is non-conductive to initiate a flow of current therein.

3. A bistable electric circuit comprising an electric discharge device having an anode, a cathode, and a control electrode, a transistor having a base electrode, an emitter electrode and a collector electrode, a source of unidirectional electrical energy; a first circuit including in series said source, a first resistor, the cathode and anode of said discharge device, and a second resistor; a second circuit including in series said source, said first resistor, the collector and base electrodes of said transistor, and a third resistor; means connecting said base electrode and said control electrode; and means connecting said anode and said emitter electrode; means including a resistance-capacitance network connected to said control electrode and to said source to control the switching time of the circuit, the flow of current in said first circuit when said discharge device is conductive being effective to produce a potential drop across said second resistor sufficient to hold said emitter electrode at a potential such that said transistor is substantially non-conductive, and the flow of current in said second circuit when said transistor is conductor being effective to produce potential drops across said first and third resistors sufficient to hold said cathode and control electrode at relative potentials tending to cut off the flow of current in said first circuit so that when said discharge device is conducting current, said transistor is substantially cut off, and when said transistor is conducting current, said discharge device is substantially cut off; signal input terminals for the bistable circuit, and means operatively connecting a given one of said input terminals to said control electrode and to said base electrode, and effective upon receipt of a signal at said given input terminal to initiate a flow of current in the one of said first and second circuits which is then non-conductive.

4. A bistable electric circuit as defined in claim 3, in which said means connecting said given input terminal to the control electrode and to the base electrode comprises first, second and third capacitors connected in series between said base electrode and said cathode, a conductive connection between said control electrode and the junction between said first and second capacitors, and a conductive connection between said given input terminal and the junction between said second and third capacitors.

5. A bistable circuit as defined in claim 4, comprising a fourth resistor connected in parallel with said first capacitor.

6. A multivibrator circuit, comprising an electric discharge device having an anode, a cathode and a control electrode, a source of unidirectional electrical energy, a first resistor, an electric current path including said source, said anode and cathode, and said resistor in series, a capacitor, means providing a periodically varying electrical potential, a charging current path including in series said means, said capacitor, said control electrode and said cathode; a second resistor, and a discharging current path for said capacitor including said capacitor, said second resistor and said means providing said periodically varying electrical potential; and a pair of output terminals connected across said first resistor, said means providing said periodically varying electrical potential being effective during a high potential period to transmit a potential to said control electrode to render said discharge device conductive and to charge said capacitor at a predetermined rate while said charging current path is conductive, said capacitor when completely charged cooperating with said first resistor to bias said discharge device toward cut off, whereupon said discharging current path becomes effective to discharge the capacitor at a rate determined independently of said charging rate, thereby producing at said output terminals a series of mark pulses of predetermined duration corresponding to periods when said discharge device is conductive and separated by spaces corresponding to periods when said discharge device is not conductive.

7. A free-running multivibrator circuit comprising an electric discharge device having an anode, a cathode, and a control electrode, a transistor having a base electrode, an emitter electrode and a collector electrode, a source of unidirectional electrical energy; a first electric current path including in series said source, a first resistor, the cathode and anode of said discharge device, and a second resistor; a second electric current path including in series said source, said first resistor, the collector and base electrodes of said transistor, and a third resistor; and means directly connecting said anode and said emitter electrode, the flow of current in said first path when said discharge device is conductive being effective to produce a potential drop across said second resistor sufficient to hold said emitter electrode at a potential such that said transistor is substantially non-conductive, the flow of current in said second path when said transistor is conductive being effective to produce a potential drop across said first resistor sufficient to hold said cathode at a potential tending to cut off the flow of current in said path, and feedback means connecting said second path and said control electrode and effective after said second path is non-conductive for a predetermined time to transmit to said control electrode a potential effective to cut off the flow of current in said first path, and effective after said second path is conductive for a predetermined time to transmit to said control electrode a potential effective to initiate a flow of current in said first path, so that the circuit alternates between a condition in which said first path is conductive and a condition in which said second path is conductive.

8. A free-running multivibrator circuit as defined in claim 7 in which said feedback means comprises a capacitor and a fourth resistor connected in series between said base electrode and said cathode, and a conductive connection between said control electrode and the junction between said capacitor and said fourth resistor.

9. A frequency divider circuit comprising an electric discharge device having an anode, a cathode and a control electrode; a transistor having a base electrode, an emitter electrode and a collector electrode; a source of unidirectional electrical energy; a first circuit including in series said source, a first resistor, said anode and said cathode of said discharge device, and a second resistor; a second circuit including in series said source, a third resistor, said base electrode and said collector of said transistor, and said second resistor; means directly connecting said anode to said emitter electrode; means including a resistance-capacitance network connected to said control electrode and to said source to control the switching time of the circuit, the flow of current in said first circuit when said discharge device is conductive being effective to produce a potential drop across said first resistor sufficient to hold said emitter electrode at a potential such that said second circuit is substantially non-conductive, and the flow of current in said second circuit when said transistor is conductive being effective to produce a potential drop across said second resistor sufficient to hold said cathode at a potential tending to cut off the flow of current in said first circuit, so that when said discharge device is conducting current said transistor is substantially cut off and when said transistor is conducting current said discharge device is substantially cut off; a pair of signal input terminals, means connecting said signal input terminals in a circuit which includes said control electrode and said cathode of said discharge device and effective upon receipt of a plurality of successive signal pulses at said input terminals to transmit to said discharge device control electrode a potential effective to initiate flow of current in said first circuit, and means effective when said discharge device and said first circuit remain conductive for a predetermined time to cut off the flow of current therein and to render said transistor and said second circuit conductive.

10. A frequency divider circuit as defined in claim 9 in which said means connecting said signal input terminals in a circuit which includes said control electrode and said cathode comprises a capacitor connected between a given one of said signal input terminals and said control electrode, a connection between the other signal input terminal and a given terminal of said source of unidirectional electrical energy, and means including a fourth resistor connecting said control electrode and said given terminal of said source.

11. A switching circuit comprising an electric discharge device having an output electrode, an input electrode and a common electrode; a transistor having an output electrode, an input electrode and a common electrode; a source of unidirectional electrical energy; a first circuit including in series said source, said output and common electrodes of said electric discharge device, and an impedance; a second circuit including in series said source, said output and common electrodes of said transistor, and said impedance; negative cross-feedback means connecting said output electrode of said electric discharge device to said input electrode of said transistor and connecting said output electrode of said transistor to said input electrode of said electric discharge device, said cross-feedback means acting when said discharge device becomes conductive to transmit to the input electrode of said transistor a signal effective to cut off flow of the current in said second circuit and acting when said transistor becomes conductive to transmit to said input electrode of said discharge device a signal effective to cut off flow of current in said first circuit; and means including a resistance-capacitance network connected to said input electrode of said discharge device and to said source to control the switching time of said switching circuit.

12. A switching circuit as defined in claim 11 which comprises a pair of signal input terminals, and means connecting said signal input terminals to an input circuit which includes said input electrode and said common electrode of said discharge device and connecting said signal input terminals to an input circuit which includes said input electrode and said common electrode of said transistor and effective upon receipt of a signal at said input terminals to initiate a flow of current in that circuit of said first and second circuits which then is nonconductive.

13. A switching circuit as defined in claim 11 in which said second circuit comprises a second impedance connected between said common electrode of said transistor and a terminal of said source, said first named impedance being connected between the output electrode of said transistor and the opposite terminal of said source, said impedances cooperating with said source to provide respectively at said common and output electrodes of said transistor two potentials varying with the current flowing through said second circuit, said cross-feedback means comprising means connecting said common and output electrodes of said transistor respectively to said input and common electrodes of said electric discharge device so that said two potentials of said second circuit control the conductivity of said electric discharge device.

14. A multivibrator circuit comprising an electric discharge device having an output electrode, an input electrode and a common electrode; a transistor having an output electrode, an input electrode and a common electrode; a source of unidirectional electrical energy; a discharge device output circuit including in series said source, said output and common electrodes of said electric discharge device, and an impedance; a transistor output circuit including in series said source, said output and common electrodes of said transistor and said impedance; a discharge device input circuit including in series said input and common electrodes of said discharge device; a transistor input circuit including in series said input and common electrodes of said transistor; and negative cross-feedback means connecting said output electrode of said electric discharge device to said input circuit of said transistor and connecting said output electrode of said transistor to said input circuit of said electric discharge device, said cross-feedback means acting when said discharge device becomes conductive to transmit to said input circuit of said transistor a signal effective to cut off the flow of the current in said transistor output circuit and acting when said transistor becomes conductive to transmit to said input circuit of said discharge device a signal effective to cut off flow of current in said discharge device output circuit; and means including a resistance-capacitance network connected to said input electrodes and to said source and effective when one of said output circuits remains conductive for a predetermined time to cut off the flow of current therein and to render the other output circuit conductive.

References Cited in the file of this patent

UNITED STATES PATENTS

| | | |
|---|---|---|
| 2,506,439 | Bergfors | May 2, 1950 |
| 2,562,171 | Butman | July 31, 1951 |
| 2,605,306 | Eberhard | July 29, 1952 |
| 2,623,170 | Dickinson | Dec. 23, 1952 |
| 2,628,310 | Wood | Feb. 10, 1953 |
| 2,695,959 | Mohr | Nov. 30, 1954 |
| 2,701,309 | Barney | Feb. 1, 1955 |
| 2,707,752 | Gobler | May 3, 1955 |
| 2,717,961 | Johnstone | Sept. 13, 1955 |
| 2,744,198 | Raisbeck | May 1, 1956 |
| 2,761,965 | Dickinson | Sept. 4, 1956 |

UNITED STATES PATENT OFFICE

CERTIFICATE OF CORRECTION

Patent No. 2,935,690 May 3, 1960

Carl A. Bergfors

It is hereby certified that error appears in the printed specification of the above numbered patent requiring correction and that the said Letters Patent should read as corrected below.

Column 3, line 30, for "$9_b$" read -- 9b --; column 12, line 8, for "said path" read -- said first path --.

Signed and sealed this 18th day of October 1960.

(SEAL)
Attest:

KARL H. AXLINE
Attesting Officer

ROBERT C. WATSON
Commissioner of Patents